(12) United States Patent
Lee

(10) Patent No.: US 11,715,524 B2
(45) Date of Patent: Aug. 1, 2023

(54) MEMORY DEVICE AND OPERATING METHOD THEREOF

(71) Applicant: SK hynix Inc., Gyeonggi-do (KR)

(72) Inventor: Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 110 days.

(21) Appl. No.: 17/168,778

(22) Filed: Feb. 5, 2021

(65) Prior Publication Data

US 2022/0044732 A1 Feb. 10, 2022

(30) Foreign Application Priority Data

Aug. 10, 2020 (KR) ........................ 10-2020-0100169

(51) Int. Cl.
| | | |
|---|---|---|
| G11C 16/14 | (2006.01) | |
| G11C 16/10 | (2006.01) | |
| G11C 16/26 | (2006.01) | |
| G11C 16/08 | (2006.01) | |
| G11C 16/30 | (2006.01) | |
| G11C 16/24 | (2006.01) | |
| G11C 16/34 | (2006.01) | |
| G11C 16/16 | (2006.01) | |

(52) U.S. Cl.
CPC .............. *G11C 16/14* (2013.01); *G11C 16/08* (2013.01); *G11C 16/10* (2013.01); *G11C 16/16* (2013.01); *G11C 16/24* (2013.01); *G11C 16/26* (2013.01); *G11C 16/30* (2013.01); *G11C 16/3404* (2013.01); *G11C 2216/28* (2013.01)

(58) Field of Classification Search
CPC ......... G11C 16/14; G11C 16/08; G11C 16/10; G11C 16/16; G11C 16/24; G11C 16/26; G11C 16/30; G11C 16/3404; G11C 2216/28; G11C 2216/16; G11C 16/0483
See application file for complete search history.

(56) References Cited

U.S. PATENT DOCUMENTS

| | | | | |
|---|---|---|---|---|
| 7,852,680 B2 | 12/2010 | Kuo | | |
| 2008/0205140 A1* | 8/2008 | Lee | ........................ | G11C 16/08 438/257 |
| 2008/0205141 A1* | 8/2008 | Lee | ..................... | H01L 29/7923 257/E27.103 |
| 2008/0225594 A1* | 9/2008 | Lee | ..................... | H01L 29/7923 257/E21.602 |

(Continued)

FOREIGN PATENT DOCUMENTS

KR 10-2002-0071713 9/2002

*Primary Examiner* — Jay W. Radke
(74) *Attorney, Agent, or Firm* — IP&T Group LLP

(57) ABSTRACT

There are provided a memory device and an operating method thereof. The memory device includes: a memory block including a plurality of memory cells; and a peripheral circuit for performing a program operation and an erase operation on the memory block. The program operation is performed by using a hole injection method, and the erase operation is performed by using an electron charging method. The plurality of memory cells are programmed when a threshold voltage of each of at least some of the plurality of memory cells is decreased to be less than a set level in the program operation, and are erased when the threshold voltage of each of the plurality of memory cells is increased to be the set level or higher in the erase operation.

15 Claims, 14 Drawing Sheets

(56) References Cited

U.S. PATENT DOCUMENTS

| | | | | |
|---|---|---|---|---|
| 2008/0253186 A1* | 10/2008 | Lee | ............... | H01L 27/115 |
| | | | | 438/257 |
| 2008/0266980 A1* | 10/2008 | Wu | ............... | G11C 16/10 |
| | | | | 365/185.27 |
| 2009/0310405 A1* | 12/2009 | Lee | ............... | G11C 16/12 |
| | | | | 365/189.11 |
| 2010/0124118 A1* | 5/2010 | Lee | ............... | H01L 29/7923 |
| | | | | 438/257 |
| 2012/0044771 A1* | 2/2012 | Joo | ............... | G11C 16/3404 |
| | | | | 365/185.22 |
| 2019/0333592 A1* | 10/2019 | Lee | ............... | G11C 11/5671 |

* cited by examiner

MEMORY DEVICE AND OPERATING METHOD THEREOF

CROSS-REFERENCE TO RELATED APPLICATION

The present application claims priority under 35 U.S.C. § 119(a) to Korean patent application number 10-2020-0100169, filed on Aug. 10, 2020, which is incorporated herein by reference in its entirety.

BACKGROUND

Field of Invention

The present disclosure generally relates to an electronic device, and more particularly, to a memory device and an operating method thereof.

Description of Related Art

The paradigm on the recent computer environment has transitioned to ubiquitous computing in which computing systems can be used anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In exemplary memory systems having such advantages, the data storage device includes a Universal Serial Bus (USB) memory device, memory cards having various interfaces, a Solid State Drive (SSD), and the like.

Generally, there are two types of memory devices: volatile memory devices and nonvolatile memory devices.

A nonvolatile memory device has relatively slow write and read speeds, but retains stored data even when the supply of power is interrupted. Thus, a nonvolatile memory device is used to store data to be retained regardless of whether power is supplied. Examples of the volatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. A flash memory may be a NOR type flash memory or a NAND type flash memory.

SUMMARY

Embodiments provide a memory device which programs memory cells such that a threshold voltage of the memory cells is less than a set level in a program operation of the memory device and erases memory cells such that a threshold voltage of the memory cells is the set level or higher in an erase operation of the memory device, and an operation method of the memory device.

In accordance with an aspect of the present disclosure, there is provided a memory device including: a memory block including a plurality of memory cells; and a peripheral circuit configured to perform a program operation and an erase operation on the memory block, wherein the program operation is performed by using a hole injection method, and the erase operation is performed by using an electron charging method, wherein the plurality of memory cells are programmed when a threshold voltage of each of at least some of the plurality of memory cells is decreased to be less than a set level in the program operation, and are erased when the threshold voltage of each of the plurality of memory cells is increased to be the set level or higher in the erase operation.

In accordance with another aspect of the present disclosure, there is provided a method for operating a memory device, the method including: programming memory cells in an erase state, which are coupled to a selected word line in a memory block when a threshold voltage of each of the memory cells is decreased to be less than the set level by using a hole injection method, wherein each of the memory cells in the erase state has a threshold voltage greater than or equal to a set voltage level.

In accordance with still another aspect of the present disclosure, there is provided a method for operating a memory device, the method including: erasing memory cells in a program state, which are coupled to at least one selected word line in a memory block when a threshold voltage of each of the memory cells is increased to be the set level or higher by using an electron charging method, wherein each of the memory cells in the program state has a threshold voltage less than a set voltage level.

BRIEF DESCRIPTION OF THE DRAWINGS

Embodiments of the invention are described below with reference to the accompanying drawings; however, the invention may be embodied in different forms and thus should not be construed as limited to the embodiments set forth herein. Rather, these embodiments are provided so that this disclosure is thorough and complete, and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. Also, throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

DETAILED DESCRIPTION

The specific structural and functional description disclosed herein is provided for the purpose of describing embodiments of the present disclosure. The invention, however, can be implemented in various forms, and this is not limited to the embodiments set forth herein.

Embodiments of the present disclosure are described in detail below with reference to the accompanying drawings to enable those skilled in the art to practice and readily implement the present invention.

Figure 1:
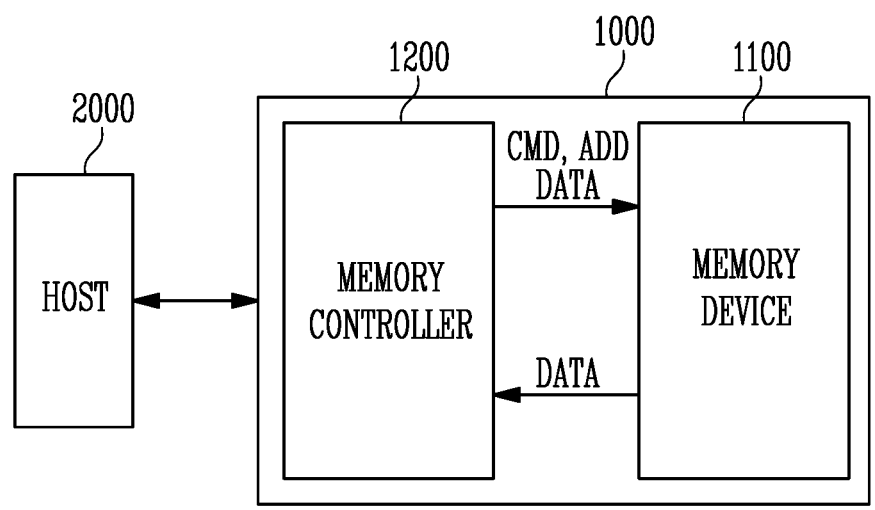
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 may include a memory device 1100 configured to store data and a memory controller 1200 configured to control the memory device 1100 under the control of a host 2000.

The host 2000 may communicate with the memory system 1000 by using an interface protocol such as Peripheral Component Interconnect-Express (PCI-E), Advanced Technology Attachment (ATA), Serial ATA (SATA), Parallel ATA (PATA), or Serial Attached SCSI (SAS). Any of various other interface protocols, such as a Universal Serial Bus (USB), a Multi-Media Card (MMC), an Enhanced Small Disk Interface (ESDI), and/or an Integrated Drive Electronics (IDE), also may be used. More generally, any suitable interface protocol may be used.

The memory controller 1200 may control overall operation of the memory system 1000, and control data exchange between the host 2000 and the memory device 1100. For example, the memory controller 1200 may control the memory device 1100 to program or read data according to a request of the host 2000. In a program operation, the memory controller 1200 may transmit, to the memory device 1100, a command CMD corresponding to the program operation, an address ADD, and data DATA to be programmed. Also, in a read operation, the memory controller 1200 may receive and temporarily store data DATA read from the memory device 1100, and transmit the temporarily stored data DATA to the host 2000.

The memory device 1100 may perform a program, read or erase operation under the control of the memory controller 1200. The memory device 1100 in accordance with an embodiment of the present disclosure may control a threshold voltage of memory cells to be less than a set level by using a hole injection method in a program operation, and control a threshold voltage of memory cells to be the set level or higher by using an electron charging method in an erase operation. That is, in an embodiment of the present disclosure, a threshold voltage of a memory cell in an erase state is higher than that of a memory cell in a program state.

In some embodiments, the memory device 1100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR), a Rambus Dynamic Random Access Memory (RDRAM), or a flash memory.

Figure 2:
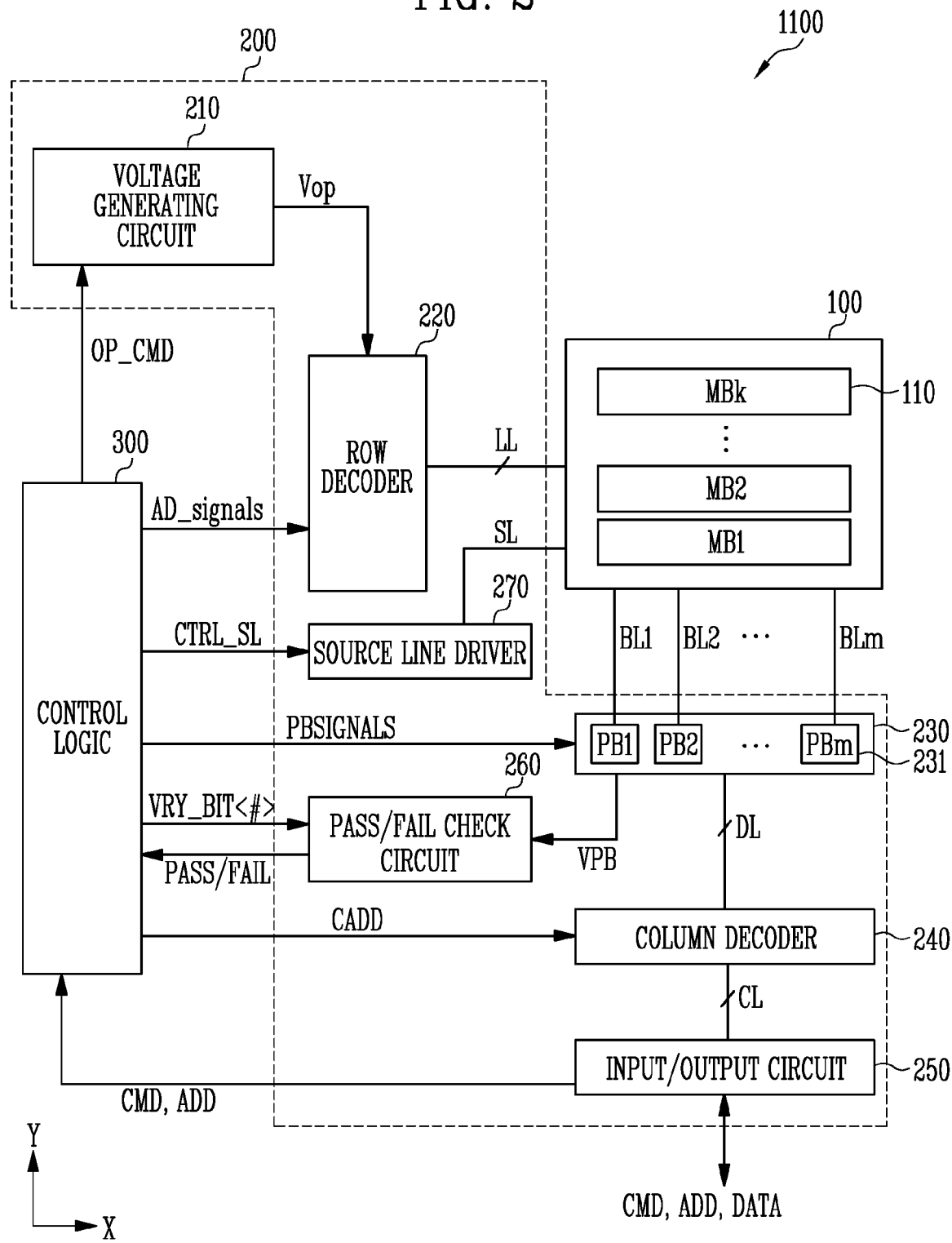
FIG. 2 is a diagram illustrating a memory device, such as that shown in FIG. 1.

FIG. 2 is a diagram illustrating the memory device shown in FIG. 1.

Referring to FIG. 2, the memory device 1100 may include a memory cell array 100 in which data is stored. The memory device 1100 may include a peripheral circuit 200 configured to perform a program operation for storing data in the memory cell array 100, a read operation for outputting stored data, and an erase operation for erasing stored data. The memory device 1100 may include control logic 300 which controls the peripheral circuit 200 under the control of the memory controller 1200 (shown in FIG. 1).

The memory cell array 100 may include a plurality of memory blocks MB1 to MBk 110 (k is a positive integer of 2 or more). Local lines LL and bit lines BL1 to BLm (m is a positive integer of 2 or more) may be coupled to each of the memory blocks MB1 to MBk 110. For example, the local lines LL may include a first select line, a second select line, and a plurality of word lines arranged between the first and second select lines. Also, the local lines LL may include dummy lines arranged between the first select line and the word lines and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to each of the memory blocks MB1 to MBk 110, and the bit lines BL1 to BLm may be commonly coupled to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be stacked in a direction vertical to a substrate in memory blocks 110 having a three-dimensional structure.

The peripheral circuit 200 may perform program, read, and erase operations of a selected memory block 110 under the control of the control logic 300. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a first program operation voltage, a second program operation voltage, a select line operation voltage, and the like in a program operation under the control of the control logic 300. The voltage generating circuit 210 may generate an erase voltage, a pass voltage, a select line operation voltage, and the like in an erase operation under the control of the control logic 300.

The row decoder 220 may transfer the operating voltages Vop to the local lines coupled to the selected memory block 110 in response to row decoder control signals AD_signals. For example, in a program operation, the row decoder 220 may apply the first program operation voltage generated by the voltage generating circuit 210 to the word lines of the selected memory block and apply the second program operation voltage generated by the voltage generating circuit 210 to a selected word line among the word lines of the selected memory block, in response to the row decoder control signals AD_signals. Also, in a program operation, the row decoder 220 may apply the select line operation voltage generated by the voltage generating circuit 210 to a selected drain select line among the drain select lines of the selected memory block in response to the row decoder control signals AD_signals. Also, in an erase operation, the row decoder 220 may apply the erase voltage to the selected word line of the selected memory block and apply the pass voltage to the other unselected word lines, in response to the row decoder control signals AD_signals.

The page buffer group 230 may include a plurality of page buffers PB1 to PBm 231 coupled to the bit lines BL1 to BLm, which may operate in response to page buffer control signals PBSIGNALS. For example, in a program operation, the page buffers PB1 to PBm 231 may temporarily store data to be programmed and control a potential level of the bit lines BL1 to BLm, based on the temporarily stored data to be programmed. For example, the page buffers PB1 to PBm 231 may apply a program allow voltage to a selected bit line among the bit lines BL1 to BLm and apply a program inhibit voltage to unselect bit line(s), based on the temporarily stored data to be programmed.

Also, in an erase operation, the page buffers PB1 to PBm 231 may apply an erase allow voltage to a selected bit line among the bit lines BL1 to BLm and apply an erase inhibit voltage to unselected bit line(s).

Also, in a read or program verify operation, the page buffers PB1 to PBm may sense a voltage or current of the bit lines BL1 to BLm.

The column decoder 240 may transfer data between the input/output circuit 250 and the page buffer group 230 in response to a column address CADD. For example, the column decoder 240 may exchange data with the page buffers 231 through the data lines DL, or exchange data with the input/output circuit 250 through column lines CL.

In a read operation or a program verify operation, the pass/fail check circuit 260 may generate a reference current in response to an allow bit VRY_BIT<#>, and output a pass signal PASS or a fail signal FAIL by comparing a sensing voltage VPB received from the page buffer group 230 with a reference voltage generated by the reference current. The sensing voltage VPB may be a voltage controlled based on a number of memory cells determined as pass in the program verify operation.

The source line driver 270 may be coupled to a memory cell included in the memory cell array 100 through a source line SL, and control a voltage applied to the source line SL. The source line driver 270 may receive a source line control signal CTRL_SL from the control logic 300, and control a source line voltage applied to the source line SL, based on the source line control signal CTRL_SL.

The control logic 300 may control the peripheral circuit 200 by outputting the operation signal OP_CMD, the row decoder control signals AD_signals, the page buffer control signals PBSIGNALS, and the allow bit VRY_BIT<#> in response to a command CMD and an address ADD. The control logic 300 may control the peripheral circuit 200 to program memory cells when a threshold voltage of the memory cells is less than a set level by using a hole injection method in a program operation, and control the peripheral circuit 200 to erase memory cells when a threshold voltage of the memory cells is the set level or higher by using an electron charging method in an erase operation.

Figure 3:
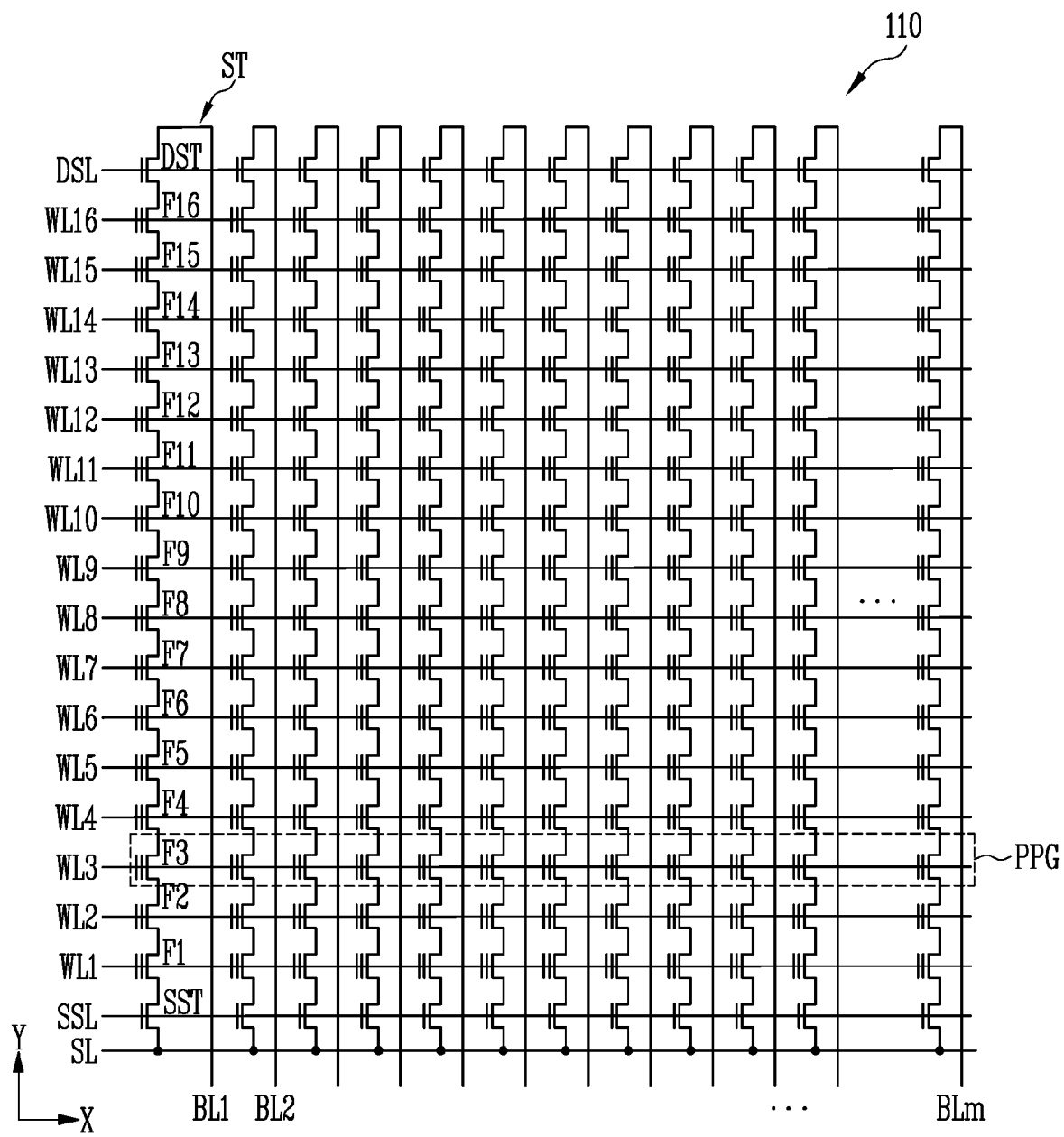
FIG. 3 is a diagram illustrating a representative memory block, such as of those shown in FIG. 2.

FIG. 3 is a diagram illustrating a representative memory block of those shown in FIG. 2.

Referring to FIG. 3, in the memory block 110, a plurality of word lines arranged in parallel to one another may be coupled between a first select line and a second select line. The first select line may be a source select line SSL, and the second select line may be a drain select line DSL. More specifically, the memory block 110 may include a plurality of strings ST coupled between bit lines BL1 to BLm and a source line SL. The bit lines BL1 to BLm may be coupled to the strings ST, respectively, and the source line SL may be commonly coupled to the strings ST. Each of the strings ST may be configured identically, and therefore, a string ST coupled to a first bit line BL1 is described in detail as an example.

The string ST may include a source select transistor SST, a plurality of memory cells F1 to F16, and a drain select transistor DST, which are coupled in series between the source line SL and the first bit line BL1. At least one source select transistor SST and at least one drain select transistor DST may be included in one string ST, and more than 16 memory cells F1 to F16, as shown in the drawing, may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, and gates of memory cells F1 to F16 included in different strings ST may be coupled to a plurality of word lines WL1 to WL16. A group of memory cells coupled to the same word line among memory cells included in different strings ST may be referred as a page PPG. Therefore, the same number of pages PPG as word lines WL1 to WL16 may be included in the memory block 110.

Figure 4:
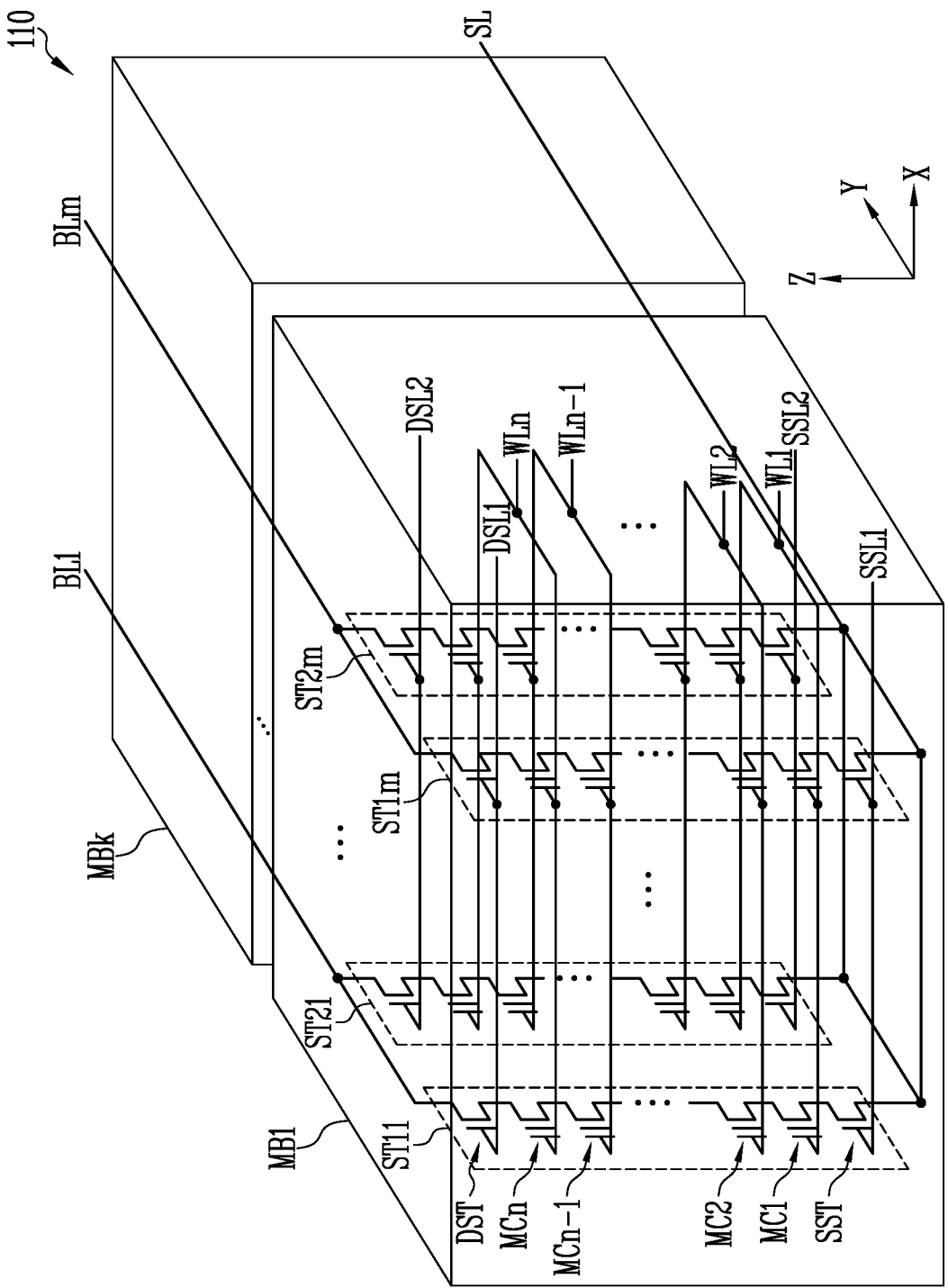
FIG. 4 is a diagram illustrating an embodiment of a three-dimensionally configured memory block.

FIG. 4 is a diagram illustrating an embodiment of a three-dimensionally configured memory block.

Referring to FIG. 4, the memory cell array 100 may include a plurality of memory blocks MB1 to MBk 110. The memory block 110 may include a plurality of strings ST11 to ST1m and ST21 to ST2m. In an embodiment, each of the plurality of strings ST11 to ST1m and ST21 to ST2m may be formed in an 'I' shape or a 'U' shape. In a first memory block MB1, m strings may be arranged in a row direction (X direction). Although a case where two strings are arranged in a column direction (Y direction) is illustrated in FIG. 4, this is for clarity; three or more strings may be arranged in the column direction (Y direction).

Each of the plurality of strings ST11 to ST1m and ST21 to ST2m may include at least one source select transistor SST, first to nth memory cells MC1 to MCn, and at least one drain select transistor DST.

The source select transistor SST of each string may be coupled between a source line SL and memory cells MC1 to MCn. Source select transistors of strings arranged on the same row may be coupled to the same source select line. Source select transistors of strings ST11 to ST1m arranged on a first row may be coupled to a first source select line SSL1. Source select transistors of strings ST21 to ST2m arranged on a second row may be coupled to a second source select line SSL2. In another embodiment, the source select transistors of the strings ST11 to ST1m and ST21 to ST2m may be commonly coupled to one source select line.

The first to nth memory cells MC1 to MCn of each string may be coupled in series to each other between the source select transistor SST and the drain select transistor DST. Gates of the first to nth memory cells MC1 to MCn may be respectively coupled to first to nth word lines WL1 to WLn.

In an embodiment, at least one of the first to nth memory cells MC1 to MCn may be used as a dummy memory cell. When the dummy memory cell is provided, a voltage or current of a corresponding string can be stably controlled. Accordingly, the reliability of data stored in the memory block 110 can be improved.

The drain select transistor DST of each string may be coupled between a bit line and the memory cells MC1 to MCn. Drain select transistors DST of strings arranged in the row direction may be coupled to a drain select line extending in the row direction. Drain select transistors DST of the strings ST11 to ST1m on the first row may be coupled to a first drain select line DSL1. Drain select transistors DST of the strings ST21 to ST2m on the second row may be coupled to a second drain select line DSL2.

Figure 5:
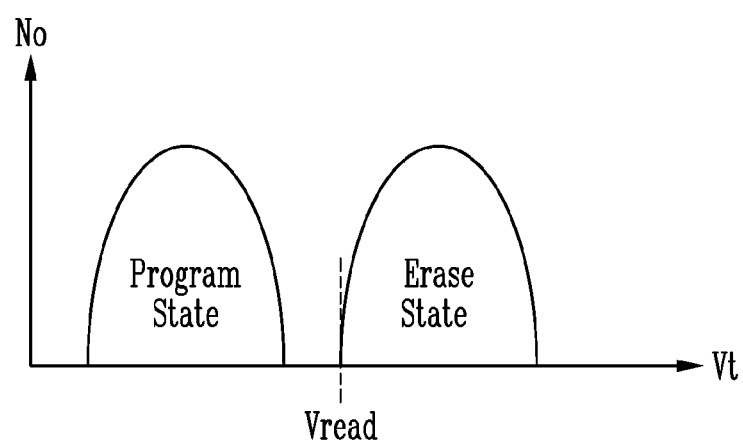
FIG. 5 is a threshold voltage distribution diagram illustrating an erase state and a program state of memory cells in accordance with an embodiment of the present disclosure.

FIG. 5 is a threshold voltage distribution diagram illustrating an erase state and a program state of memory cells in accordance with an embodiment of the present disclosure.

Referring to FIG. 5, programmed memory cells, i.e., memory cells in a program state (Program) have a threshold voltage distribution lower than a set level (Vread). For example, the memory cells in the program state may have a negative threshold voltage value lower than 0V.

In addition, erased memory cells, i.e., memory cells in an erase state (Erase) have a threshold voltage distribution which is the set level, i.e., Vread, or higher. For example, the memory cells in the erase state may have a positive threshold voltage value.

For example, the memory cells in the program state may be in a state in which data "0" is stored, and the memory cells in the erase state may be in a state in which data "1" is stored.

Figure 6:
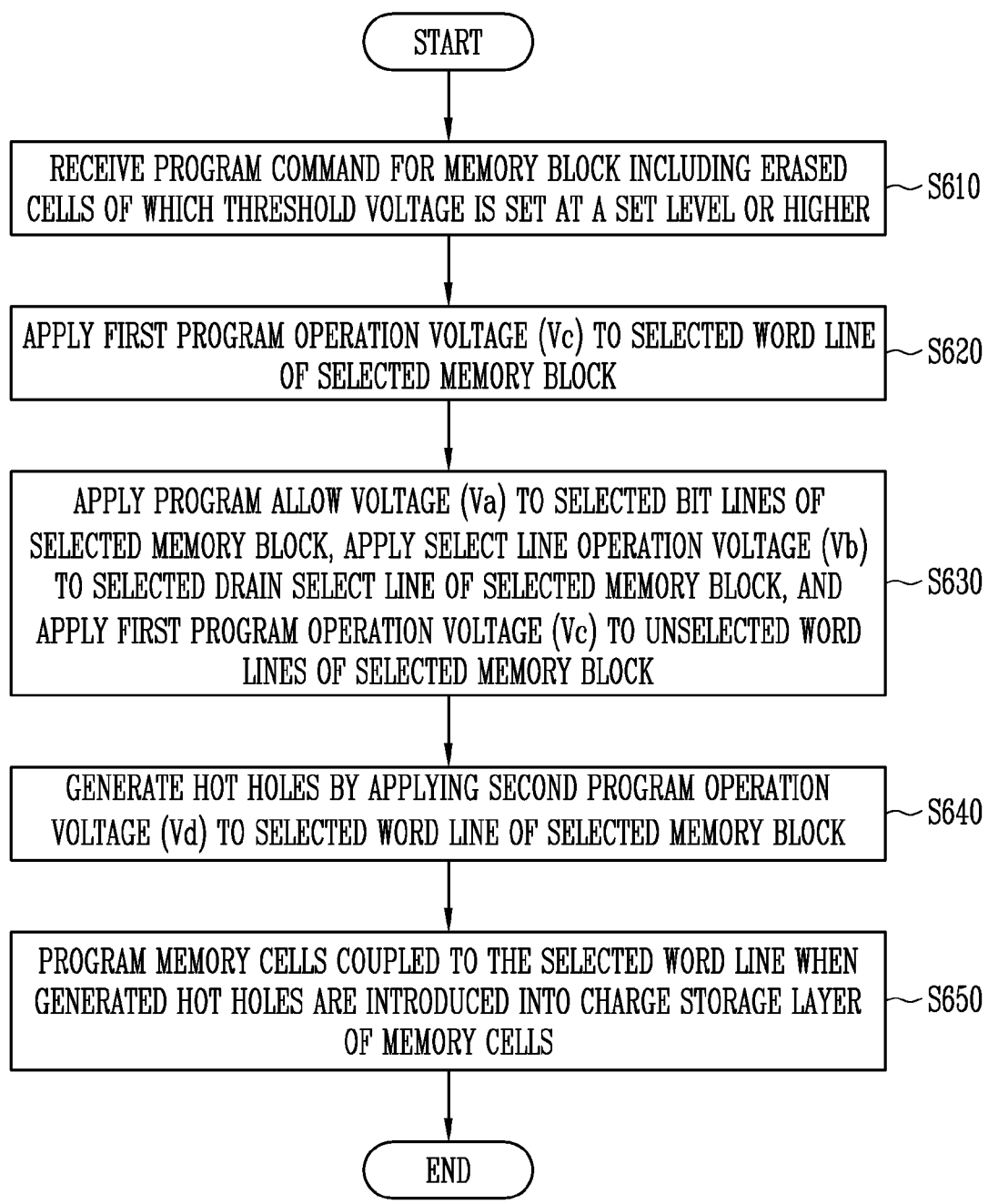
FIG. 6 is a flowchart illustrating a program operation of the memory device in accordance with a first embodiment of the present disclosure.

FIG. 6 is a flowchart illustrating a program operation of the memory device in accordance with a first embodiment of the present disclosure.

Figure 7:
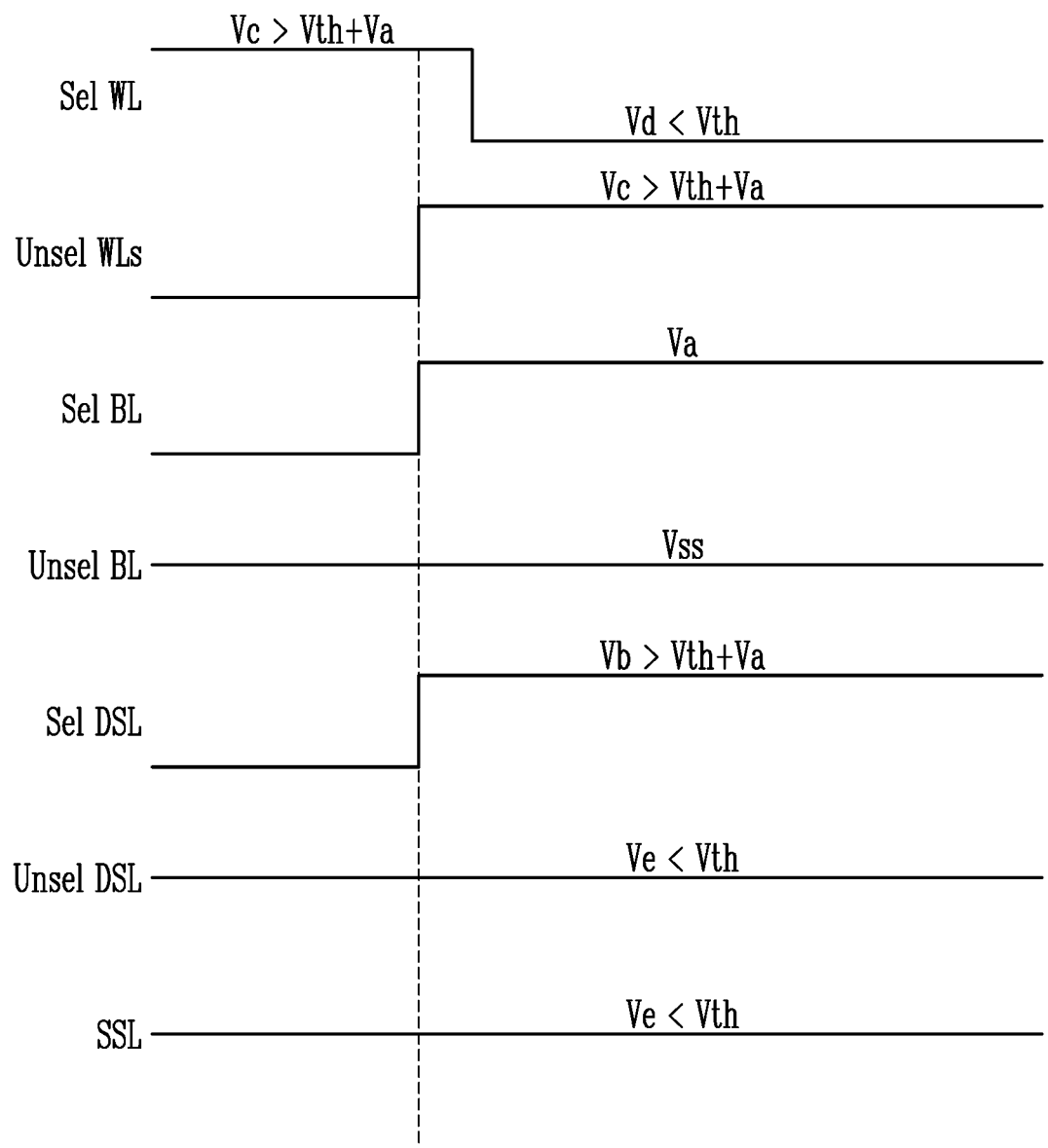
FIG. 7 is a waveform diagram of signals, illustrating the program operation of the memory device in accordance with the first embodiment of the present disclosure.

FIG. 7 is a waveform diagram of signals, illustrating the program operation of the memory device in accordance with the first embodiment of the present disclosure.

The program operation of the memory device in accordance with the first embodiment of the present disclosure is described below with reference to FIGS. 2 to 7.

In operation S610, the memory device 1100 receives a program command CMD for a selected memory block among a plurality of memory blocks MB1 to MBk. The memory device 1100 may receive data DATA to be programmed and an address ADD together with the program command CMD. The selected memory block (e.g., MB1) is an erased memory block in which memory cells are in an erased state. Such memory cells are erased when a threshold voltage of the memory cells is a set level (Vread) or higher.

The control logic 300 of the memory device 1100 controls the peripheral circuit 200 to perform a program operation on the selected memory block MB1 by using a hot hole injection method in response to the program command CMD.

In operation S620, the peripheral circuit 200 applies a first program operation voltage Vc to a selected word line Sel WL (e.g., WL1) of the selected memory block MB1.

For example, the voltage generating circuit 210 generates the first program operation voltage Vc in response to the operation signal OP_CMD. The first program operation voltage Vc may be greater than the sum of a threshold voltage Vth of a memory cell in an erased state and a program allow voltage Va to be applied to selected bit lines Sel BL.

The row decoder 220 applies the first program operation voltage Vc generated by the voltage generating circuit 210 to the selected word line Sel WL (WL1) of the selected memory block MB1 in response to the row decoder control signals AD_signals.

In operation S630, the peripheral circuit 200 applies the program allow voltage Va to the selected bit lines Sel BL coupled to memory cells to be programmed in a program state among bit lines BL1 to BLm of the selected memory block MB1, and applies a program inhibit voltage to unselected bit lines Unsel BL. The program allow voltage Va is greater than the program inhibit voltage. The program allow voltage Va may be, for example, a power voltage Vcc. The program inhibit voltage may be a ground voltage Vss.

For example, the page buffers PB1 to PBm 231 of the page buffer group 230 temporarily store data DATA to be programmed in response to the page buffer control signals PBSIGNALS, apply the program allow voltage Va to the selected bit lines Sel BL, based on the temporarily stored data to be programmed, and apply the program inhibit voltage Vss to the unselected bit lines Unsel BL.

Also, the peripheral circuit 200 applies the first program operation voltage Vc to unselected word lines Unselect WLs (e.g., WL2 to WLn) of the selected memory block MB1, and applies a select line operation voltage Vb to a selected drain select line Sel DSL. The select line operation voltage Vb may be greater than the sum of a threshold voltage Vth of the drain select transistor DST and the program allow voltage Va. Therefore, a channel of strings corresponding to the selected bit lines Sel BL among a plurality of strings ST included in the selected memory block MB1 is charged with the program allow voltage Va.

For example, the voltage generating circuit 210 generates the first program operation voltage Vc and the select line operation voltage Vb in response to the operation signal OP_CMD, and the row decoder 220 applies the first program operation voltage Vc generated by the voltage generating circuit 210 to the unselected word lines Unsel WLs (WL2 to WLn) of the selected memory block MB1 and applies the select line operation voltage Vb to the selected drain select line Sel DSL, in response to the row decoder control signals AD_signals.

An inactive operation voltage Ve is continuously applied to the unselected drain select line Unsel DSL and a source select line SSL, and accordingly, drain select transistors DST coupled to the unselected drain select line Unsel DSL and source select transistors SST coupled to the source select line SSL maintain a turn-off state. The inactive operation voltage Ve may be lower than a threshold voltage Vth of the drain select transistors DST and the source select transistors SST.

In operation S640, after the program allow voltage Va is applied to the channel of the strings ST corresponding to the selected bit lines Sel BL, the peripheral circuit 200 applies a second program operation voltage Vd to the selected word line Sel WL1. The second program operation voltage Vd may be lower than the threshold voltage Vth of the memory cell in the erase state. Therefore, Gate Induce Drain Leakage (GIDL) hot holes are generated in the channel of selected memory cells MC1 coupled to the selected bit lines Sel BL and the selected word line Sel WL (WL1) due to a difference between potentials applied to a drain and a gate.

In operation S650, hot holes generated in a lower channel of the selected memory cells MC1 are introduced into a charge storage layer of the selected memory cells MC1 by the second program operation voltage Vd applied to the selected word line Sel WL (WL1). Therefore, the threshold voltage of the selected memory cells MC1 is decreased, and hence the selected memory cells MC are programmed to a state in which the threshold voltage of the selected memory cells MC1 is lower than the set level Vread.

When the program operation of the memory cells coupled to the selected word line is completed as described above, a program operation of memory cells coupled to a next word line may be performed. That is, the program operation can be performed, using the above-described hole injection method, by sequentially selecting word lines of the selected memory block.

Figure 8:
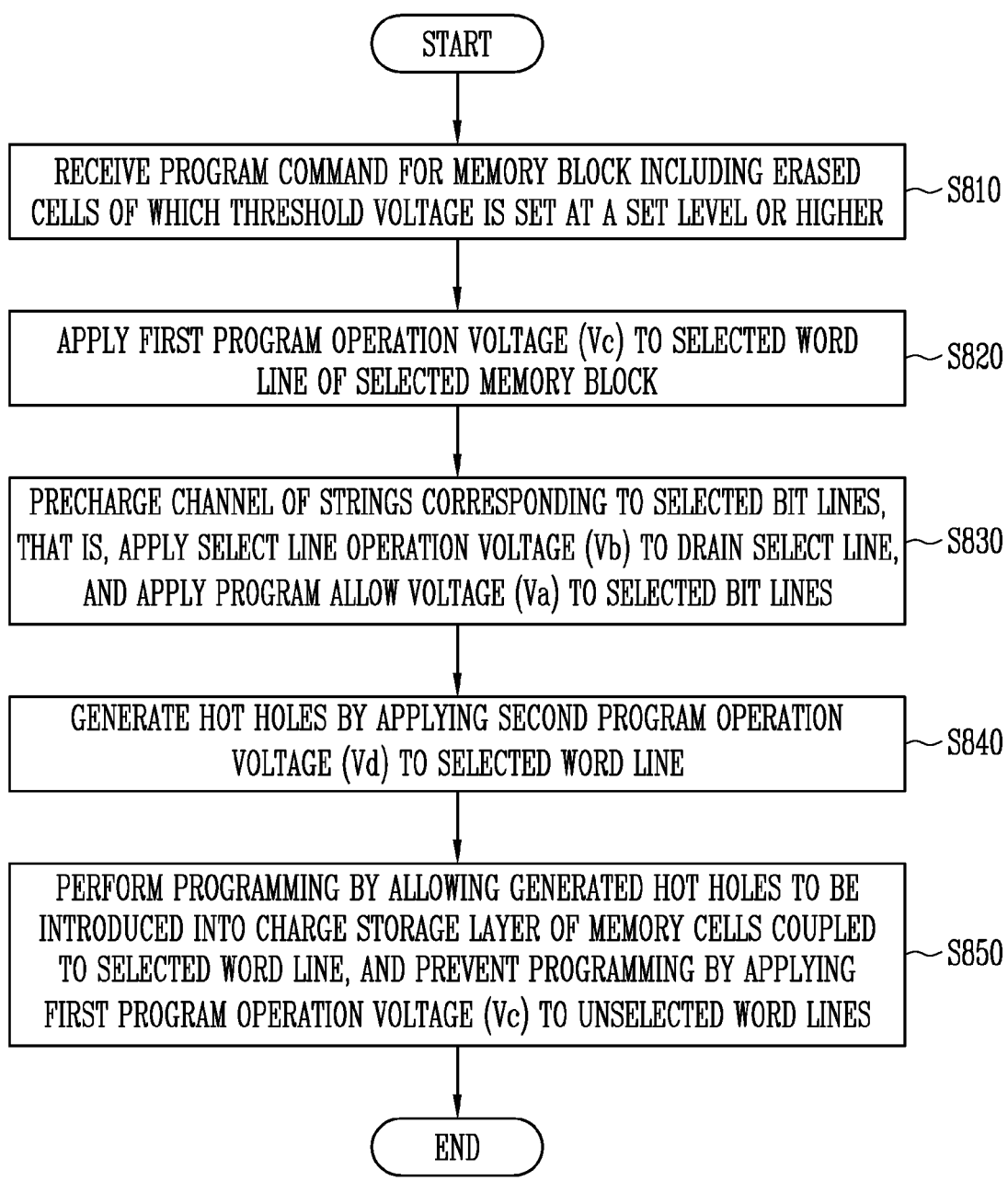
FIG. 8 is a flowchart illustrating a program operation of the memory device in accordance with a second embodiment of the present disclosure.

FIG. 8 is a flowchart illustrating a program operation of the memory device in accordance with a second embodiment of the present disclosure.

Figure 9:
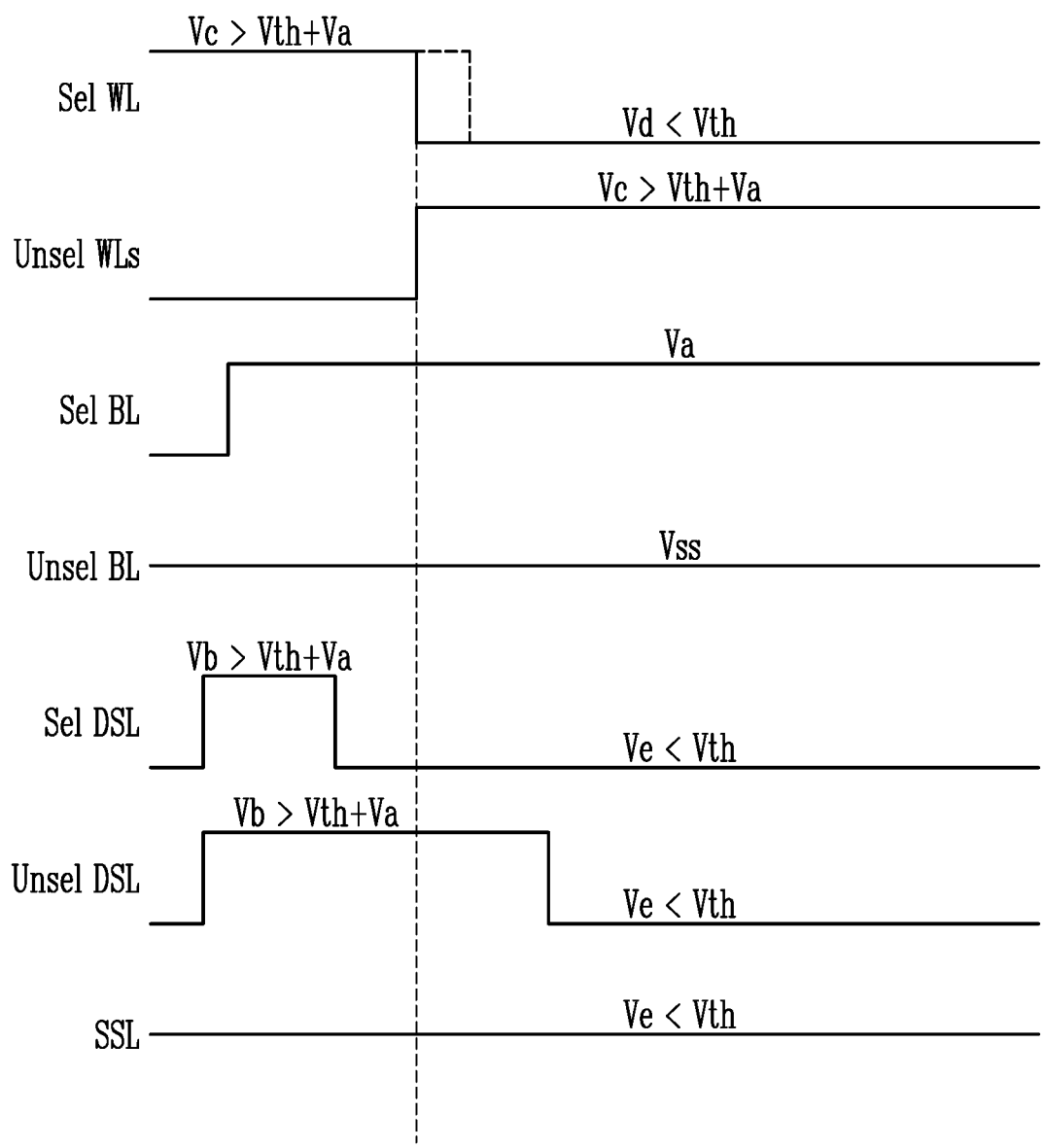
FIG. 9 is a waveform diagram of signals, illustrating the program operation of the memory device in accordance with the second embodiment of the present disclosure.

FIG. 9 is a waveform diagram of signals, illustrating the program operation of the memory device in accordance with the second embodiment of the present disclosure.

The program operation of the memory device in accordance with the second embodiment of the present disclosure is described as follows with reference to FIGS. 2 to 5, 8, and 9.

In operation S810, the memory device 1100 receives a program command CMD for a selected memory block among a plurality of memory blocks MB1 to MBk. The memory device 1100 may receive data DATA to be programmed and an address ADD together with the program command CMD. The selected memory block (e.g., MB1) is an erased memory block, that is, in a state in which memory cells have been erased. Memory cells in the erased memory block are erased when a threshold voltage of the memory cells is a set level Vread or higher.

The control logic 300 of the memory device 1100 controls the peripheral circuit 200 to perform a program operation on the selected memory block MB1 by using a hot hole injection method in response to the program command CMD.

In operation S820, the peripheral circuit 200 applies a first program operation voltage Vc to a selected word line (e.g., WL1) of the selected memory block MB1.

For example, the voltage generating circuit 210 generates the first program operation voltage Vc in response to the operation signal OP_CMD. The first program operation voltage Vc may be greater than the sum of a threshold voltage Vth of a memory cell in an erase state and a program allow voltage Va to be applied to selected bit lines Sel BL.

The row decoder 220 applies the first program operation voltage Vc generated by the voltage generating circuit 210 to the selected word line Sel WL (WL1) of the selected memory block MB1 in response to the row decoder control signals AD_signals.

In operation S830, the peripheral circuit 200 precharges a channel of strings ST corresponding to the selected bit lines Sel BL of the selected memory block MB1.

For example, the peripheral circuit 200 applies the program allow voltage Va to the selected bit lines Sel BL coupled to memory cells to be programmed in a program state among the bit lines BL1 to BLm, and applies a program inhibit voltage Vss to unselected bit lines Unsel BL. The program allow voltage Va may be, for example, a power voltage Vcc. The program inhibit voltage may be a ground voltage Vss. Also, the peripheral circuit 200 applies a select line operation voltage Vb to a selected drain select line Sel DSL. The select line operation voltage Vb may be greater than the sum of a threshold voltage Vth of the drain select transistor DST and the program allow voltage Va. Therefore, the channel of the strings ST corresponding to the selected bit lines Sel BL among a plurality of strings ST included in the selected memory block MB1 is precharged with the program allow voltage Va.

For example, the page buffers PB1 to PBm 231 of the page buffer group 230 temporarily store data DATA to be programmed in response to the page buffer control signals PBSIGNALS, apply the program allow voltage Va to the selected bit lines Sel BL, based on the temporarily stored data to be programmed, and apply the program inhibit voltage Vss to the unselected bit lines Unsel BL.

For example, the voltage generating circuit 210 generates the select line operation voltage Vb in response to the operation signal OP_CMD, and the row decoder 220 applies the select line operation voltage Vb generated by the voltage generating circuit 210 to the selected drain select line Sel DSL in response to the row decoder control signals AD_signals. Also, the row decoder 220 may apply the program inhibit voltage Vss to a channel of strings ST corresponding to the unselected bit lines Unsel BL by applying the select line operation voltage Vb generated by the voltage generating circuit 210 to an unselected drain select line Unsel DSL in response to the row decoder control signals AD_signals.

After the channel of the strings ST corresponding to the selected bit lines Sel BL is precharged, the peripheral circuit 200 may float the channel of the strings ST corresponding to the selected bit lines Sel BL by applying an inactive operation voltage Ve to the selected drain select line Sel DSL.

The inactive operation voltage Ve is continuously applied to the source select line SSL, and accordingly, source select transistors SST coupled to the source select line SSL maintains the turn-off state. The inactive operation voltage Ve may be lower than a threshold voltage Vth of drain select transistors DST and the source select transistors SST.

In operation S840, hot holes are generated in a lower channel of selected memory cells MC1 coupled to the selected word line Sel WL (WL1) by applying the first program operation voltage Vc to unselected word lines Unsel WLs (e.g., WL2 to WLn) and applying a second program operation voltage Vd to the selected word line Sel WL (WL1).

For example, the channel of the strings corresponding to the selected bit lines Sel BL is boosted by the first program operation voltage Vc applied to the unselected word lines Unsel WLs (WL2 to WLn). When the second program voltage Vd is applied to the selected word line Sel WL (WL1), Gate Induce Drain Leakage (GIDL) hot holes are generated in the channel of the selected memory cells MC1 coupled to the selected word line Sel WL (WL1) due to a difference between potentials applied to a drain and a gate.

The unselected drain select line Unsel DSL maintains a state in which the select line operation voltage Vb generated by the voltage generating circuit 210 is applied, and accordingly, a phenomenon can be prevented, in which the channel is boosted when the program inhibit voltage Vss is applied to the channel of the strings ST corresponding to the unselected bit lines Unsel BL.

In operation S850, the hot holes generated in the lower channel of the selected memory cells MC1 are introduced into a charge storage layer of the selected memory cells MC1 by the second program operation voltage Vd applied to the selected word line Sel WL (WL1). Therefore, the threshold voltage of the selected memory cells MC1 is decreased, and hence the selected memory cells MC are programmed to a state in which the threshold voltage of the selected memory cells MC1 is lower than the set level Vread.

When the program operation of the memory cells coupled to the selected word line is completed as described above, a program operation of memory cells coupled to a next word line may be performed. That is, the program operation can be performed, using the above-described hole injection method, by sequentially selecting word lines of the selected memory block.

Figure 10:
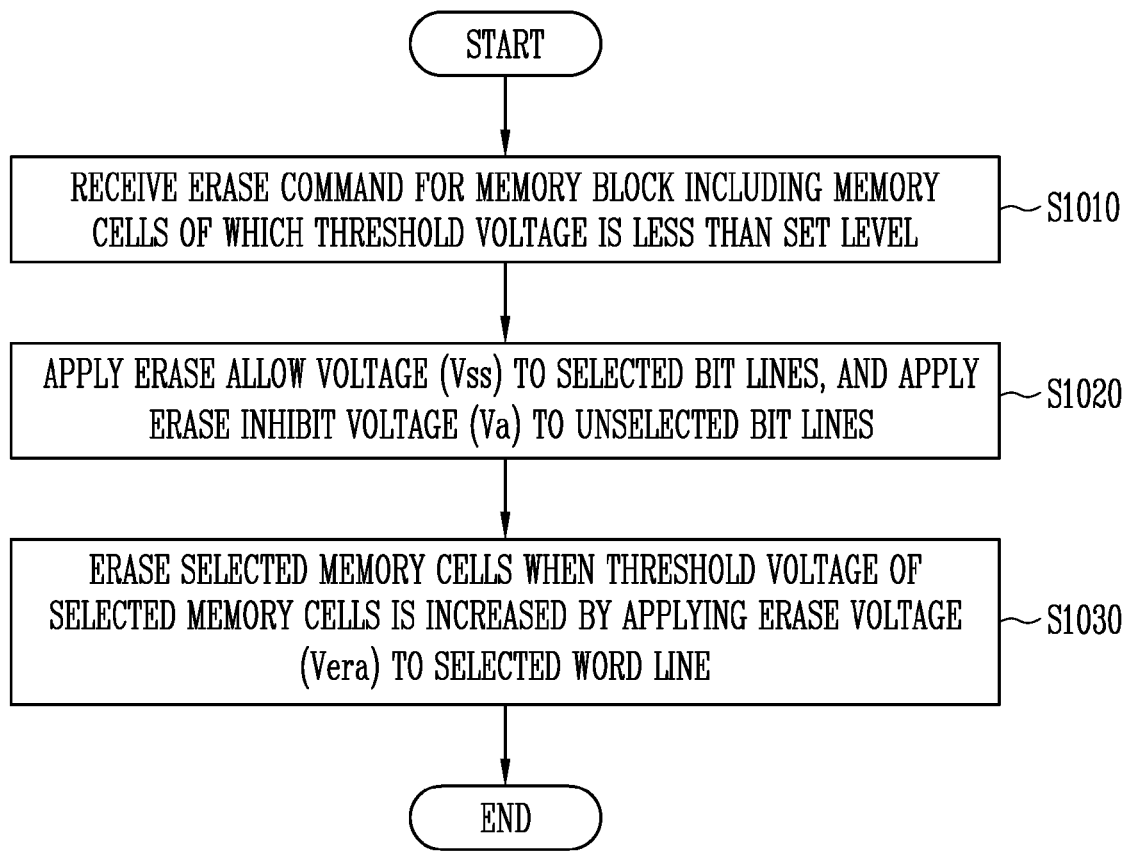
FIG. 10 is a flowchart illustrating an erase operation of the memory device in accordance with an embodiment of the present disclosure.

FIG. 10 is a flowchart illustrating an erase operation of the memory device in accordance with an embodiment of the present disclosure.

Figure 11:
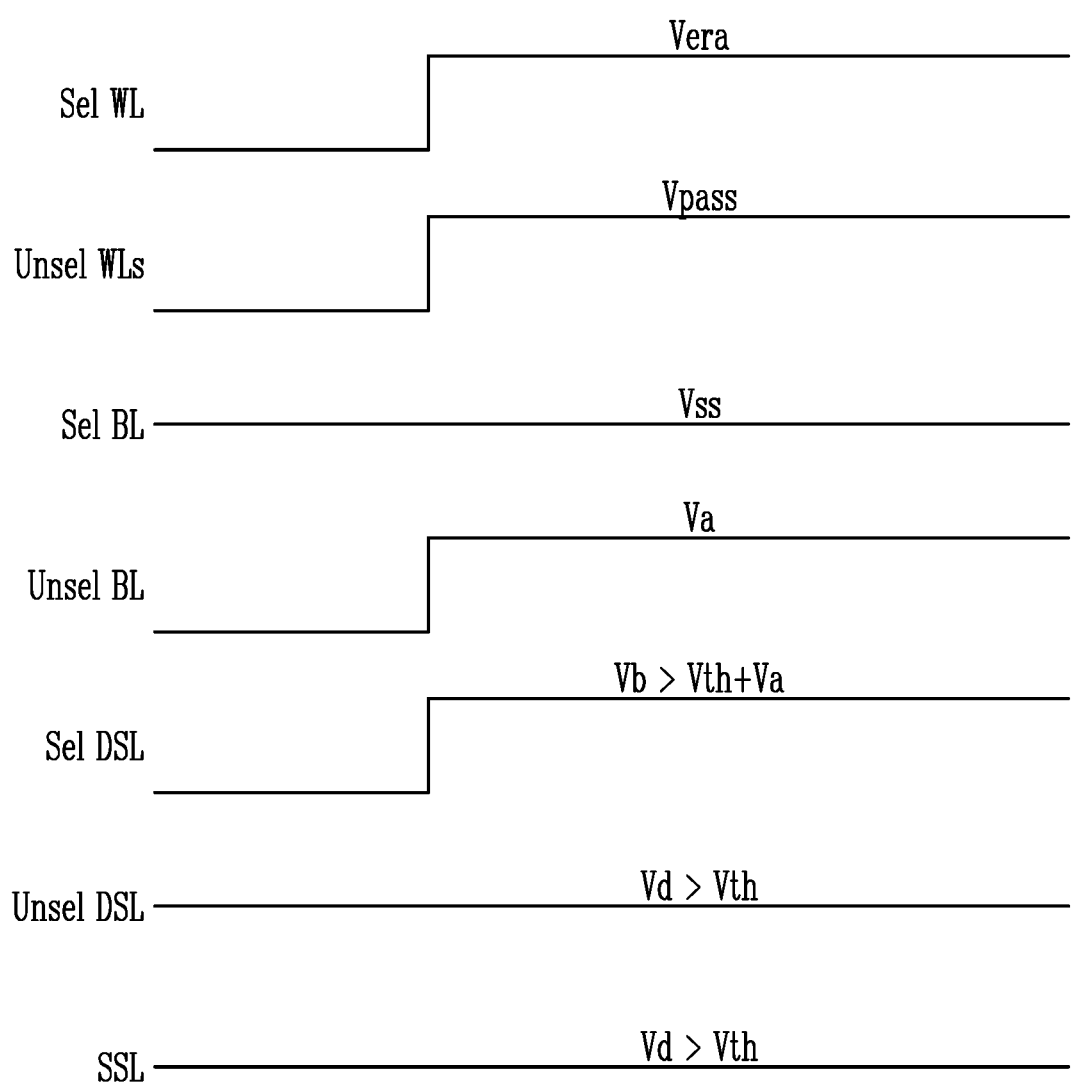
FIG. 11 is a waveform diagram of signals, illustrating the erase operation of the memory device in accordance with an embodiment of the present disclosure.

FIG. 11 is a waveform diagram of signals, illustrating the erase operation of the memory device in accordance with an embodiment of the present disclosure.

The erase operation of the memory device in accordance with an embodiment of the present disclosure is described as follows with reference to FIGS. 2 to 5, 10, and 11.

In operation S1010, the memory device 1100 receives an erase command CMD for a selected memory block among a plurality of memory blocks MB1 to MBk. The memory device 1100 may receive an address ADD together with the erase command CMD. The selected memory block (e.g., MB1) is a programmed memory block, that is, at least some of its memory cells are in a programmed state. A memory cell is in a programmed state when its threshold voltage is less than a set level, i.e., Vread. That is, the programmed memory block has been subjected to a program operation performed by using the hole injection method described with reference to FIG. 6 or 8.

The control logic 300 of the memory device 1100 controls the peripheral circuit 200 to perform an erase operation on the selected memory block MB1 by using an electron charging method in response to the erase command CMD.

In operation S1020, the peripheral circuit 200 applies an erase allow voltage (e.g., a ground voltage Vss) to selected bit lines Sel BL among the bit lines BL1 to BLm, and applies an erase inhibit voltage Va to unselected bit lines Unsel BL. The erase inhibit voltage Va may be equal to the program allow voltage used in the program operation. The erase inhibit voltage Va is greater than the erase allow voltage Vss.

For example, the page buffers PB1 to PBm 231 of the page buffer group 230 applies the erase allow voltage Vss to the select bit lines Sel BL and applies the erase inhibit voltage Va to the unselected bit lines Unsel BL, in response to the page buffer control signals PBSIGNALS.

The erase allow voltage Vss is applied to a channel of strings corresponding to the selected bit lines Sel BL by applying a select line operation voltage Vb to a selected drain select line Sel DSL corresponding to the selected bit lines Sel BL.

In operation S1030, the peripheral circuit 200 erases memory cells coupled to the selected bit lines Sel BL and a selected word line Sel WL by applying an erase voltage Vera to the selected word line Sel WL and then increasing a threshold voltage of the memory cells. A pass voltage Vpass is applied to unselected word lines Unsel WLs.

For example, the voltage generating circuit 210 generates the erase voltage Vera in response to the operation signal OP_CMD. The row decoder 220 applies the erase voltage Vera generated by the voltage generating circuit 210 to the selected word line Sel WL of the selected memory block MB1 in response to the row decoder control signals AD_signals.

The erase voltage Vera having a high positive potential is applied to gates of the memory cells coupled to the selected bit lines Sel BL and the selected word line Sel WL, and the erase allow voltage Vss is applied to a channel of the memory cells coupled to the selected bit lines Sel BL and the selected word line Sel WL. Therefore, the threshold voltage of the memory cells is increased when electrons of the channel are introduced into a charge storage layer of the memory cells, and the memory cells are erased when the threshold voltage of the memory cells is increased.

As described above, in an erase operation of the memory device in accordance with an embodiment of the present disclosure, the memory cells in a selected memory block can be selectively erased in a cell unit.

Also, in another embodiment, memory cells in a selected memory block may be simultaneously erased. For example, the memory cells in the selected memory block may be simultaneously erased by applying an erase allow voltage to bit lines BL1 to BLm of the selected memory block and applying an erase voltage to word lines WL1 to WLn of the selected memory block.

Also, in another embodiment, memory cells in a selected memory block may be erased in a page unit. For example, the memory cells in the selected memory block may be simultaneously erased by applying an erase allow voltage to bit lines BL1 to BLm of the selected memory block and applying an erase voltage to a selected word line among word lines WL1 to WLn of the selected memory block.

Figure 12:
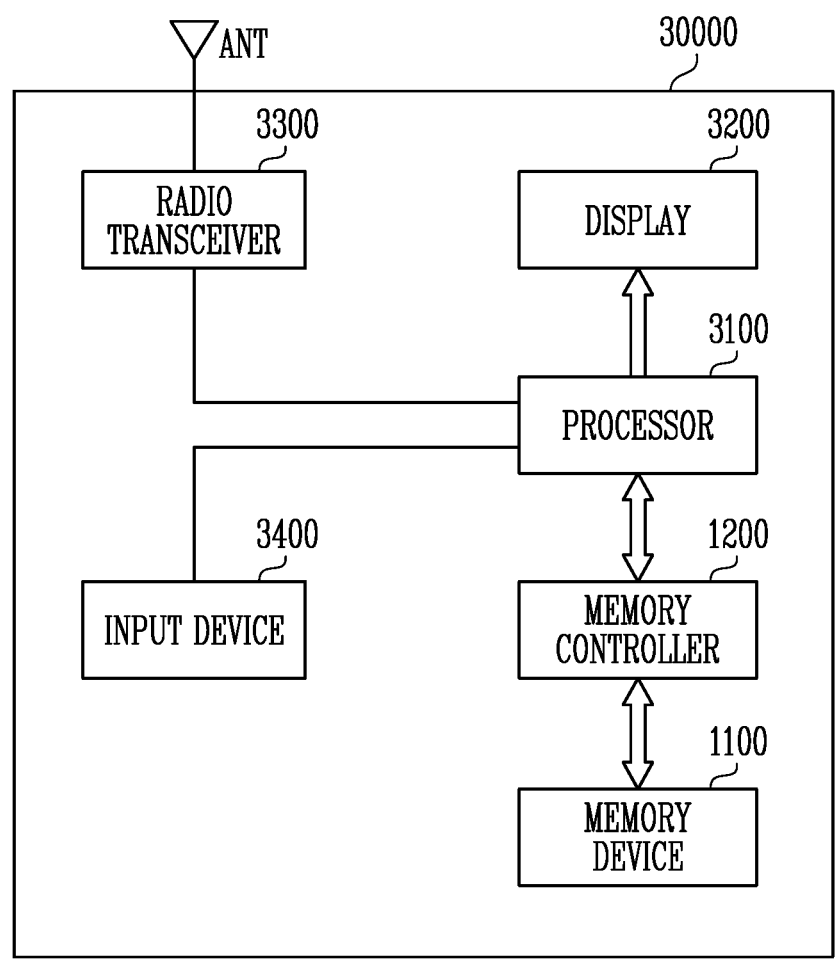
FIG. 12 is a diagram illustrating another embodiment of the memory system.

FIG. 12 is a diagram illustrating another embodiment of the memory system.

Referring to FIG. 12, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the processed signal to the memory device 1100. Also, the radio transceiver 3300 may convert a signal output from the processor 3100 into a radio signal, and output the radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100. Also, the memory controller 1200 may be implemented with the memory controller 1200 shown in FIG. 1, and the memory device 1100 may be implemented with the memory device 1100 shown in FIG. 2.

Figure 13:
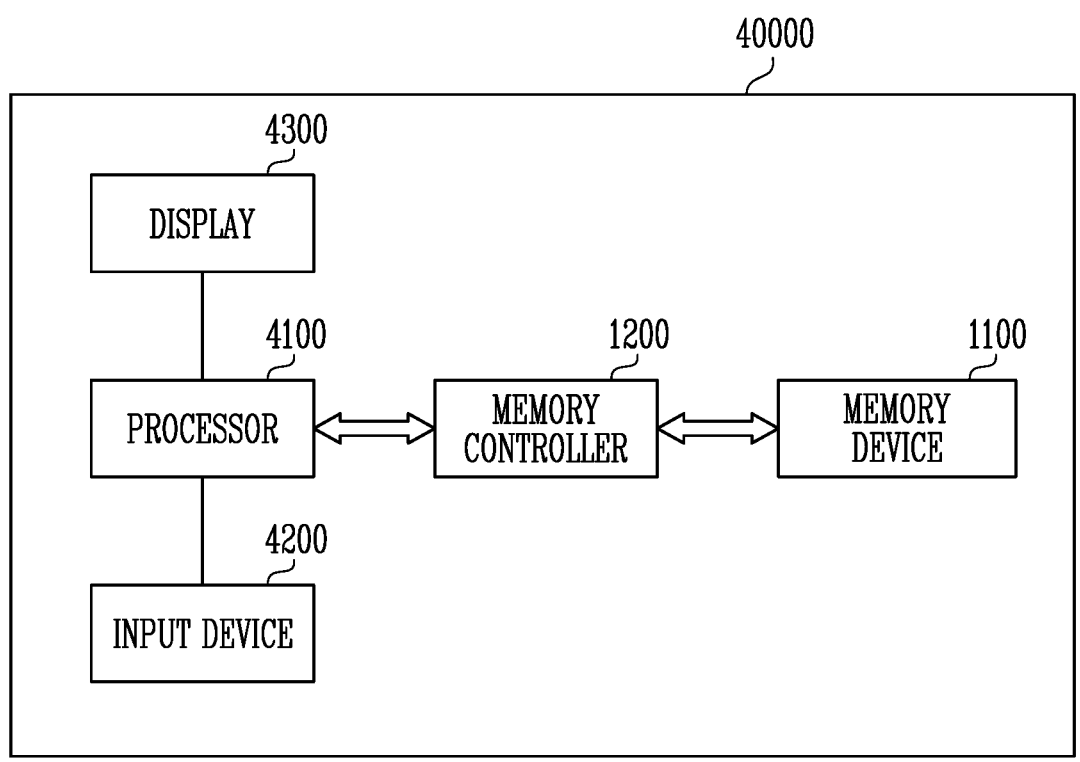
FIG. 13 is a diagram illustrating another embodiment of the memory system.

FIG. 13 is a diagram illustrating another embodiment of the memory system.

Referring to FIG. 13, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operation of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100. Also, the memory controller 1200 may be implemented with the memory controller 1200 shown in FIG. 1, and the memory device 1100 may be implemented with the memory device 1100 shown in FIG. 2.

Figure 14:
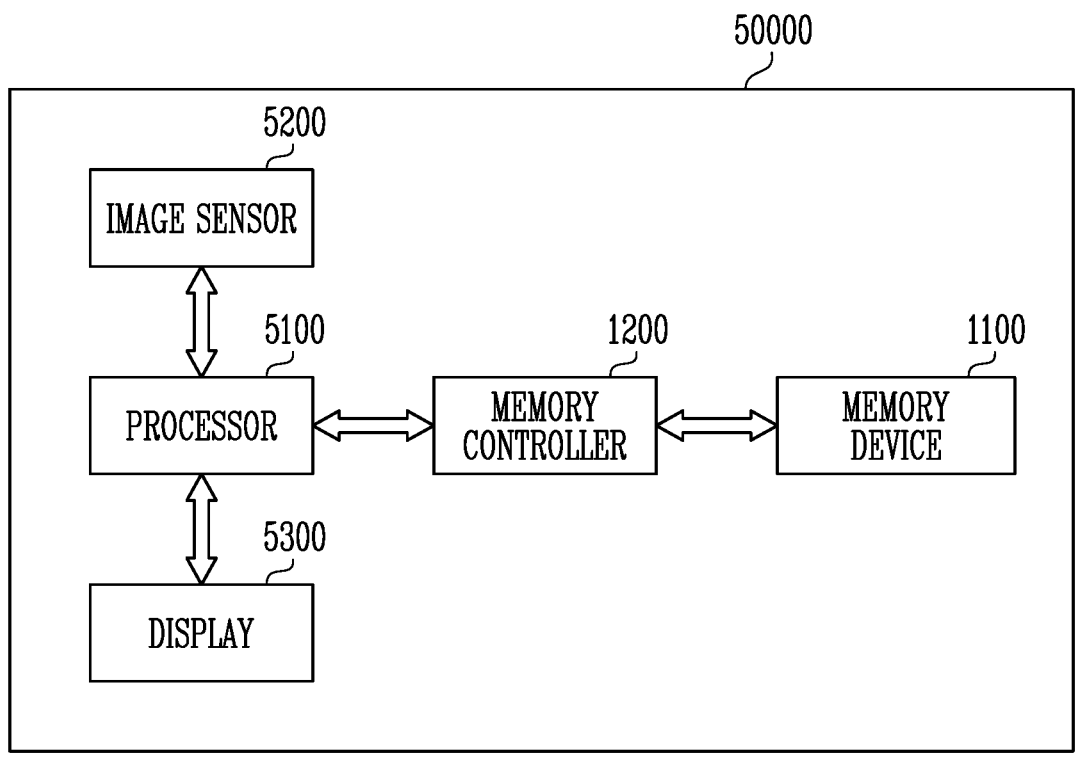
FIG. 14 is a diagram illustrating another embodiment of the memory system.

FIG. 14 is a diagram illustrating another embodiment of the memory system.

Referring to FIG. 14, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the digital signals may be transmitted to a processor 5100 or the memory controller 1200. Under the control of the processor 5100, the digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100. Also, the memory controller 1200 may be implemented with the memory controller 1200 shown in FIG. 1, and the memory device 1100 may be implemented with the memory device 1100 shown in FIG. 2.

Figure 15:
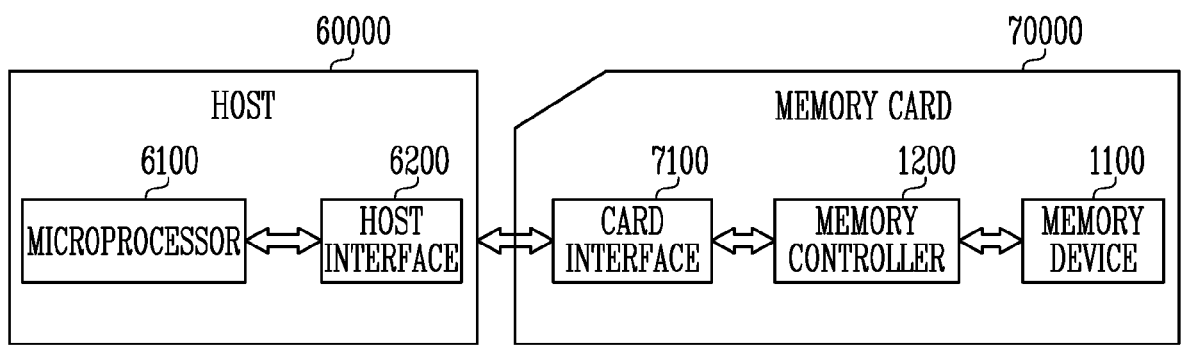
FIG. 15 is a diagram illustrating another embodiment of the memory system.

FIG. 15 is a diagram illustrating another embodiment of the memory system.

Referring to FIG. 15, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present invention is not limited thereto. Also, the memory controller 1200 may be implemented with the memory controller 1200 shown in FIG. 1, and the memory device 1100 may be implemented with the memory device 1100 shown in FIG. 2.

The card interface 7100 may be an interface that performs data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

In accordance with embodiments of the present disclosure, the memory device can control a threshold voltage of memory cells to be less than a set level by using a hole injection method in a program operation, and control a threshold voltage of memory cells to be the set level or higher by using an electron charging method in an erase operation.

While the present invention has been shown and described with reference to certain embodiments thereof, it will be understood by those skilled in the art that various changes in form and details may be made to any of the embodiments without departing from the spirit and scope of the present invention as defined by the appended claims and their equivalents. Therefore, the scope of the present invention is not limited to the disclosed embodiments but covers all variations that fall within the scope of the claims including their equivalents.

In the above-described embodiments, not all steps necessarily need be performed; in some cases, one or more may be omitted. Similarly, the steps need not necessarily be performed in the described order; in some cases, the order may be rearranged. More generally, the embodiments disclosed herein are only examples to facilitate understanding of the present invention, not to limit it. That is, it should be apparent to those skilled in the art that various modifications can be made on the basis of the technological scope of the present disclosure.

Also, although specific terminologies are used here, they are used only to explain embodiments of the present disclosure. Therefore, the present invention is not restricted by any such terms nor to any specific detail. The present invention encompasses all arrangements and configurations within the scope of the claims including their equivalents.

What is claimed is:

1. A memory device comprising:
   a memory block including a plurality of memory cells; and
   a peripheral circuit configured to perform a program operation and an erase operation on the memory block, wherein the program operation is performed by using a hole injection method, and the erase operation is performed by using an electron charging method,
   wherein the plurality of memory cells are programmed when a threshold voltage of each of at least some of the plurality of memory cells is decreased to be less than a set level in the program operation, and are erased when the threshold voltage of each of the plurality of memory cells is increased to be the set level or higher in the erase operation,
   wherein a first program operation voltage and a second program operation voltage are sequentially applied to a selected word line among a plurality of word lines coupled to the memory block and the first program operation voltage is applied to unselected word lines among the plurality of word lines in the program operation, and
   wherein the first program operation voltage is higher than a voltage applied to bit lines coupled to the memory block.

2. The memory device of claim 1, wherein the peripheral circuit includes:
   a voltage generating circuit configured to sequentially apply the first program operation voltage and the second program operation voltage to the selected word line and to apply the first program operation voltage to the unselected word lines in the program operation; and
   a page buffer group configured to apply a program inhibit voltage or a program allow voltage to the bit lines connected to the memory block in the program operation.

3. The memory device of claim 2,
   wherein, after the first program operation voltage is applied to the selected word line, the page buffer group increases a potential level of channel of strings corresponding to selected bit lines among the bit lines by applying the program allow voltage to the selected bit lines, and applies the program inhibit voltage to unselected bit lines among the bit lines.

4. The memory device of claim 3, wherein, after the potential level of the channel is increased, the voltage generating circuit generates hot holes in the channel of memory cells coupled to the selected word line among memory cells in the string by applying the second program operation voltage lower than the first program operation voltage to the selected word line.

5. The memory device of claim 4, wherein the memory cells coupled to the selected word line are programmed when threshold voltages of the memory cells are decreased by the hot holes introduced into a charge storage layer by the second program operation voltage.

6. The memory device of claim 1, wherein the peripheral circuit includes:
   a voltage generating circuit configured to apply an erase voltage to the selected word line among the plurality of word lines coupled to the memory block and to apply a pass voltage to the unselected word lines among the plurality of word lines in the erase operation; and
   a page buffer group configured to apply an erase inhibit voltage or an erase allow voltage to the bit lines coupled to the memory block in the erase operation.

7. The memory device of claim 6,
   wherein the page buffer group applies the erase allow voltage to selected bit lines among the bit lines and applies the erase inhibit voltage to unselected bit lines among the bit lines in the erase operation, and
   wherein the erase voltage is higher than the pass voltage, and the erase inhibit voltage is higher than the erase allow voltage.

8. The memory device of claim 7,
   wherein electrons are introduced into a charge storage layer of memory cells coupled to the selected word line and the selected bit lines by the erase voltage and the erase allow voltage in the erase operation, and
   wherein the memory cells coupled to the selected word line and the selected bit lines are erased when threshold voltages of the memory cells are increased.

9. A method for operating a memory device, the method comprising:
   programming memory cells from an erase state, which are coupled to a selected word line in a memory block, wherein a threshold voltage of each of the memory cells is decreased to be less than a set level by using a hole injection method;
   wherein each of the memory cells in the erase state has the threshold voltage greater than or equal to the set level,
   wherein the programming of the memory cells by using the hole injection method includes:
   applying a first program operation voltage to the selected word line among a plurality of word lines coupled to the memory block;
   applying a program allow voltage to selected bit lines among bit lines of the memory block and applying a program inhibit voltage to unselected bit lines among the bit lines; and
   applying a second program operation voltage to the selected word line, after the first program operation voltage is applied to unselected word lines among the plurality of word lines, and
   wherein the first program operation voltage is higher than the program allow voltage.

10. The method of claim 9, wherein the first program operation voltage has a potential higher than that of the sum of a threshold voltage of the memory cells and the program allow voltage.

11. The method of claim 9, wherein the second program operation voltage is lower than the threshold voltage of the memory cells.

12. The method of claim 9, wherein a channel of selected strings corresponding to the selected bit lines among a plurality of strings in the memory block is charged by the program allow voltage.

13. The method of claim 12, wherein hot holes are formed in a lower channel of selected memory cells coupled to the selected word line among the memory cells in the selected strings while the first program operation voltage applied to the selected word line is changed to the second program operation voltage.

14. The method of claim 13, wherein the selected memory cells are programmed when the threshold voltages of the selected memory cells are decreased by the hot holes introduced into a charge storage layer by the second program operation voltage.

15. The method of claim 13, wherein the program inhibit voltage is applied to a channel of unselected strings corresponding to the unselected bit lines among the plurality of strings in the memory block in a period in which the first program operation voltage applied to the selected word line is changed to the second program operation voltage.

\* \* \* \* \*